United States Patent
Tomozawa et al.

(10) Patent No.: US 7,402,841 B2
(45) Date of Patent: Jul. 22, 2008

(54) GALLIUM NITRIDE-BASED COMPOUND SEMICONDUCTOR LIGHT-EMITTING DEVICE AND ELECTRODE FOR THE SAME

(75) Inventors: Hideki Tomozawa, Chiba (JP); Mineo Okuyama, Chiba (JP); Noritaka Muraki, Chiba (JP); Soichiro Masuyama, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/572,680

(22) PCT Filed: Sep. 21, 2004

(86) PCT No.: PCT/JP2004/014128

§ 371 (c)(1),
(2), (4) Date: Mar. 20, 2006

(87) PCT Pub. No.: WO2005/029598

PCT Pub. Date: Mar. 31, 2005

(65) Prior Publication Data

US 2007/0040183 A1    Feb. 22, 2007

Related U.S. Application Data

(60) Provisional application No. 60/507,125, filed on Oct. 1, 2003.

(30) Foreign Application Priority Data

Sep. 22, 2003    (JP)    ............................ 2003-330422

(51) Int. Cl.
*H01L 23/48*    (2006.01)
*H01L 23/52*    (2006.01)
*H01L 29/40*    (2006.01)

(52) U.S. Cl. .................. 257/99; 257/103; 257/744; 257/745; 257/E33.063

(58) Field of Classification Search ............... None
See application file for complete search history.

(56) References Cited

U.S. PATENT DOCUMENTS

| | | | |
|---|---|---|---|
| 2002/0063256 A1* | 5/2002 | Lin ............................ | 257/79 |
| 2002/0185732 A1* | 12/2002 | Ho et al. .................... | 257/734 |
| 2003/0010994 A1* | 1/2003 | Chen et al. ................. | 257/99 |
| 2003/0164503 A1* | 9/2003 | Chen .......................... | 257/79 |

FOREIGN PATENT DOCUMENTS

| | | |
|---|---|---|
| JP | 10-135515 A | 5/1998 |
| JP | 10-209500 A | 8/1998 |
| JP | 10-308534 A | 11/1998 |

OTHER PUBLICATIONS

Chen et al. Microstructural investigation of oxidized Ni/Au ohmic contact to p-type GaN. Oct. 1, 1999. Journal of Applied Physics. vol. 86, No. 7. pp. 3826-3832.*

(Continued)

*Primary Examiner*—Hoang-Quan Ho
(74) *Attorney, Agent, or Firm*—Sughrue Mion, PLLC

(57) ABSTRACT

An object of the present invention is to provide a light-permeable electrode for use in a gallium nitride-based compound semiconductor light-emitting device, the electrode having improved light permeability and contact resistance.

The inventive electrode comprises a light-permeable first layer which is in contact with a surface of a p-contact layer in a gallium nitride-based compound semiconductor light-emitting device and which is capable of providing ohmic contact, and a second layer which is in contact with a part of a surface of said p-contact layer, wherein the first layer comprises a metal, or an alloy of two or more metals, selected from a first group consisting of Au, Pt, Pd, Ni, Co, and Rh, and the second layer comprises an oxide of at least one metal selected from a second group consisting of Ni, Ti, Sn, Cr, Co, Zn, Cu, Mg, and In.

16 Claims, 1 Drawing Sheet

OTHER PUBLICATIONS

Sheu et al. The effect of thermal annealing on the Ni/Au contact of p-type GaN. Mar. 15, 1998. Journal of Applied Physics. vol. 83, No. 6. pp. 3172-3175.*

Narayan et al. Formation of epitaxial Au/Ni/Au ohmic contacts to p-GaN. Nov. 18, 2002. Applied Physics Letters. vol. 81, No. 21. pp. 3978-3980.*

Liu et al. Effects of a Ni cap layer on transparent Ni/Au ohmic contacts to p-GaN. Jul./Aug. 2002. J. Vac. Sci. Technol. B 20(4). pp. 1394-1401.*

Li-Chien Chen, et al "Microstructural Investigation of Oxidized Ni/Au Ohmic Contact to p-type GaN", Journal of Applied Physics, vol. 86, No. 7, Oct. 1, 1999, pp. 3826-3832.

Jin-Kuo Ho, et al "Low-Resistance Ohmic Contacts to p-type GaN Achieved by the Oxidation of Ni/Au Films", Journal of Applied Physics, vol. 86, No. 8, Oct. 15, 1999, pp. 4491-4497.

Li-Chien Chen, "Oxidized Ni/Pt and Ni/Au Ohmic Contacts to p-type GaN", Applied Physics Letters, vol. 76, No. 25, Jun. 19, 2000, pp. 3703-3705.

D. Qiao, et al, "A Study of the Au/Ni Ohmic Contact on p-GaN", Journal of Applied Physics, vol. 88, No. 7, Oct. 1, 2000, pp. 4196-4200.

J. Narayan, et al, "Formation of Epitaxial Au/Ni/Au Ohmic Contacts to p-GaN", Applied Physics Letters, vol. 81, No. 21, Nov. 18, 2002, pp. 3978-3980.

Ho Won Jang, et al, "Mechanism for Ohmic Contact Formation of Oxidized Ni/Au on p-type GaN", Journal of Applied Physics, vol. 94, No. 3, Aug. 1, 2003, pp. 1748-1752.

D. Mistele, et al, "Investigation of Ni/Au Contacts on p-GaN Annealed in Different Atmospheres", Journal of Crystal Growth, vol. 230, No. 3/4, 2001, pp. 564-568.

B. Liu, et al, "Effects of a Ni Cap Layer on Transparent Ni/Au Ohmic Contacts to p-GaN", J. Vac. Sci Technol. B, vol. 20, No. 4, Jul./Aug. 2002, pp. 1394-1401.

J. K. Sheu, et al, "The Effect of Thermal Annealing on the Ni/Au Contact of p-type GaN", Journal of Applied Physics, vol. 83, No. 6, Mar. 15, 1998, pp. 3172-3175.

* cited by examiner

GALLIUM NITRIDE-BASED COMPOUND SEMICONDUCTOR LIGHT-EMITTING DEVICE AND ELECTRODE FOR THE SAME

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/507,125 filed on Oct. 1, 2003, pursuant to 35 U.S.C. §111(b).

TECHNICAL FIELD

The present invention relates to a gallium nitride-based light-emitting device and to an electrode for use in the device. More particularly, the invention relates to a light-permeable electrode for use in a gallium nitride-based light-emitting device.

BACKGROUND ART

In recent years, GaN-based compound semiconductor materials have drawn attention as semiconductor materials for light-emitting devices which emit short-wavelength light. A GaN-based compound semiconductor is formed on any of a variety of oxide substrates such as a sapphire single crystal or a III-V Group compound substrate, through a metal organic chemical vapor deposition method (MOCVD method), a molecular beam epitaxy method (MBE method), or a similar method. In the case of a light-emitting device employing an electrically insulating substrate such as a sapphire substrate, an electrode cannot be provided on the back surface of the substrate, unlike the case where a Group III-V semiconductor substrate such as a GaAs or GaP substrate is employed. Thus, a positive electrode and a negative electrode, constituting a pair, must be formed on the same surface of the light-emitting device.

One characteristic of the GaN-based compound semiconductor material is that a flow of current in the lateral direction is small. Although the phenomenon has not been completely elucidated, one conceivable reason is that the current flow is affected by a large number of dislocations propagating through the epitaxial crystal layers in a direction from a substrate to the top surface. Due to this characteristic, even when electrodes are formed and light is emitted through passage of electricity therebetween, the light emission is limited to a region directly below the electrodes and does not readily diffuse to a peripheral region of the electrodes. Therefore, when a conventional opaque electrode is employed, emission of light is interrupted by the electrode itself and, as sufficient light cannot be taken out from the top surface of the electrode, an intended improvement in light emission intensity has not been achieved.

To overcome this drawback, Japanese Patent Application Laid-Open (kokai) No. 6-314822 discloses a technique relating to device structure; specifically, a light-permeable electrode formed of a very thin metal film is employed as a p-type electrode and formed over virtually the entire top surface of the device, to thereby allow the emitted light to pass through the light-permeable electrode and be taken out from the top surface. In this disclosure, employment of a metallic electrode material such as Au-Ni alloy is proposed. However, the light permeability and the contact resistance are unsatisfactory. Japanese Patent Application Laid-Open (kokai) No. 10-308534 discloses an electrode of double-layer structure including an Au—Ni alloy layer and an Ni oxide layer, and the electrode has substantially improved light permeability and contact resistance. However, in the electronic apparatus industry, further improved light permeability and contact resistance have been keenly demanded.

DISCLOSURE OF INVENTION

An object of the present invention is to provide a light-permeable electrode for use in a gallium nitride-based compound semiconductor light-emitting device, the electrode having improved light permeability and contact resistance. Another object of the invention is to provide a gallium nitride-based compound semiconductor light-emitting device equipped with the light-permeable electrode.

Accordingly, the present invention provides the following.

(1) An electrode for use in a gallium nitride-based compound semiconductor light-emitting device comprising a light-permeable first layer which is in contact with a surface of a p-contact layer in a gallium nitride-based compound semiconductor light-emitting device and which is capable of providing ohmic contact, and a second layer which is in contact with a part of a surface of said p-contact layer, wherein the first layer comprises a metal, or an alloy of two or more metals, selected from a first group consisting of Au, Pt, Pd, Ni, Co, and Rh, and the second layer comprises an oxide of at least one metal selected from a second group consisting of Ni, Ti, Sn, Cr, Co, Zn, Cu, Mg, and In.

(2) An electrode for use in a gallium nitride-based compound semiconductor light-emitting device as described in (1) above, wherein the first layer further comprises Ga.

(3) An electrode for use in a gallium nitride-based compound semiconductor light-emitting device as described in (1) or (2) above, wherein a portion of the surface of the p-contact layer, which portion is not in contact with the second layer, includes an oxygen-lacking portion.

(4) An electrode for use in a gallium nitride-based compound semiconductor light-emitting device as described in any one of (1) to (3) above, which further comprises a third layer on a surface of the first layer opposite the side in contact with the p-contact layer, the third layer comprising an oxide of at least one metal selected from the second group.

(5) An electrode for use in a gallium nitride-based compound semiconductor light-emitting device as described in any one of (1) to (4) above, wherein the first layer comprises an alloy of Au with Ni and/or Co.

(6) An electrode for use in a gallium nitride-based compound semiconductor light-emitting device as described in any one of (1) to (5) above, wherein the second layer comprises an oxide of Ni and/or Co.

(7) An electrode for use in a gallium nitride-based compound semiconductor light-emitting device as described in any one of (4) to (6) above, wherein the third layer comprises an oxide of Ni and/or Co.

(8) An electrode for use in a gallium nitride-based compound semiconductor light-emitting device as described in any one of (1) to (7) above, wherein the second layer accounts for 0.01 to 90% of the surface of the p-contact layer.

(9) An electrode for use in a gallium nitride-based compound semiconductor light-emitting device as described in any one of (3) to (8) above, wherein the oxygen-lacking portion accounts for 10% or more of the surface of the p-contact layer.

(10) An electrode for use in a gallium nitride-based compound semiconductor light-emitting device as described in any one of (1) to (9) above, wherein the second layer has a thickness of 0.1 to 100 nm.

(11) An electrode for use in a gallium nitride-based compound semiconductor light-emitting device as described in any one of (5) to (10) above, wherein the alloy of the first layer has an Ni and/or Co content of 0.01 to 70 atom %.

(12) An electrode for use in a gallium nitride-based compound semiconductor light-emitting device as described in any one of (1) to (11) above, wherein the first layer has a thickness of 0.1 to 100 nm.

(13) An electrode for use in a gallium nitride-based compound semiconductor light-emitting device as described in any one of (4) to (12) above, wherein the third layer has a thickness of 1 nm or more.

(14) An electrode for use in a gallium nitride-based compound semiconductor light-emitting device as described in any one of (1) to (13) above, wherein the first layer has one or more pores in a portion thereof.

(15) An electrode for use in a gallium nitride-based compound semiconductor light-emitting device as described in any one of (1) to (14) above, wherein the first layer has a thick portion and a thin portion.

(16) A gallium nitride-based compound semiconductor light-emitting device comprising an n-contact layer, a light-emitting layer and a p-contact layer formed on a substrate, which are composed of a gallium nitride-based compound semiconductor and which are sequentially stacked in the above order, and a negative electrode and a positive electrode which are formed on a surface of the n-contact layer and a surface of the p-contact layer, respectively, wherein the positive electrode is formed of an electrode for a gallium nitride-based compound semiconductor light-emitting device as recited in any one of (1) to (15) above.

According to the present invention, there is provided a light-permeable electrode for use in a gallium nitride-based compound semiconductor light-emitting device, the electrode having excellent light permeability and low contact resistance. In addition, when the first layer is composed of an alloy, the productivity of the electrode increases, thereby reducing the production cost.

BEST MODES FOR CARRYING OUT THE INVENTION

Figure 1:
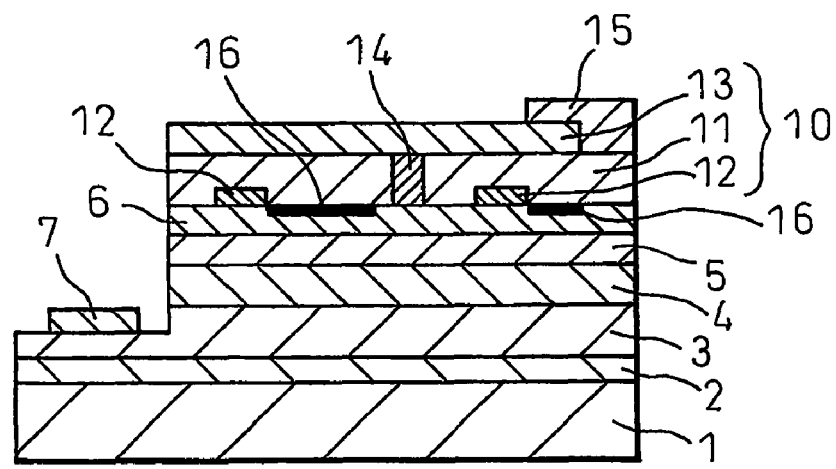
FIG. 1 is a cross-sectional view showing a gallium nitride-based compound semiconductor light-emitting device produced according to the present invention in Example 1.

No particular limitation is imposed on the type of the gallium nitride-based semiconductor employed in the present invention, and semiconductors which are known and are fabricated through a customary method may be employed. For example, there may be employed a gallium nitride-based semiconductor having a structure including a sapphire substrate; an aluminum nitride buffer layer formed on the substrate; an n-contact layer and an n-clad layer formed on the buffer layer, which are composed of an n-type GaN layer; an InGaN light-emitting layer formed on the GaN layer; a p-clad layer formed on the light-emitting layer, which is composed of a p-type AlGaN layer; and a p-contact layer formed on the p-type AlGaN layer, which is composed of a p-type GaN layer.

For a p-contact layer above, there also may be employed a p-type $Al_xGa_yIn_zN$ ($0 \leq x, y, z \leq 1$, $x+y+z=1$). Further, a thin layer of n-type $Al_xGa_yIn_zN$ ($0 \leq x, y, z \leq 1$, $x+y+z=1$) may be formed on this p-type $Al_xGa_yIn_zN$.

The electrode of the present invention for use in a gallium nitride-based compound semiconductor light-emitting device includes a light-permeable first layer which is formed on the aforementioned p-contact layer and comprises a metal or a metal alloy; and a light-permeable second layer which is formed on a portion of the p-contact layer and contains a metal oxide. In addition, a light-permeable third layer which contains a metal oxide similar to that employed in the second layer is preferably formed on a surface of the first layer opposite the side in contact with the p-contact layer, because the contact resistance further decreases.

The metal forming the first layer to be brought into contact with the semiconductor may be selected from among Au, Pt, Pd, Ni, Co and Rh, which attain excellent ohmic contact through heat treatment. These metals may be used in combination of two or more species, in the form of an alloy. In order to establish excellent ohmic contact, an alloy of these metals containing, as a micro-amount impurity, at least one metal selected from among Zn, Ge, Sn, Be, Mg, etc. may also be employed. Among metallic materials, alloys are preferred, from the viewpoint of contact resistance. In addition, the use of alloys is advantageous from the viewpoint of an increase in productivity and a decrease in production cost.

Also, the first layer may further contain Ga. It is supposed that this Ga is derived from the semiconductor layer, and the diffusion amount from the semiconductor layer is dependent on the forming and annealing conditions of the first layer. When a condition, which greatly reduces the contact resistance, is selected, Ga is contained in many case. The Ga content is preferably 0.1 to 50 atom % of total metal atom, particularly preferably 1 to 30 atom %.

Among alloys, an alloy of Au with Ni and/or Co are particularly preferred. In the alloy composition of the overall first layer, average Ni and/or Co content is 0.01 to 70 atom %. When the Ni and/or Co content is higher than 70 atom %, light permeability decreases. Reducing the average Ni and/or Co content throughout the first layer is difficult, and the reduction increases the production cost. Thus, the Ni and/or Co content is preferably 0.1 to 50 atom %, more preferably 1 to 30 atom %. The alloy composition exhibits an in-plane composition distribution profile; i.e., the alloy composition may differ from portion to portion. For example, the first layer may include a portion having an Ni and/or Co content of about 90 atom %.

The first layer may have, in a portion thereof, one or more pores having a diameter of 50 to 200 nm. When such pores are present in certain amounts in the layer, the light permeability can be improved. The total opening area of the pores is preferably 10 to 95% with respect to the total projection area of the first layer. When the ratio is 95% or higher, the sheet resistance of the first layer is prone to increase, which is not advantageous, whereas when the ratio is 10% or lower, light permeability cannot be improved. The pore size (diameter) is preferably 50 to 200 nm. These pores are conceived to be formed through aggregation of metal atoms during annealing performed in the course of oxidation/alloying. The number and pore size of the pores can be regulated by controlling annealing conditions (e.g., temperature and time), depending on the metallic species employed.

The first layer preferably has a thickness of 0.1 to 100 nm. A thickness greater than 100 nm is not preferred, because the light permeability decreases, and a thickness less than 0.1 nm is not preferred, because the contact resistance increases. Thus, the thickness is more preferably 0.2 to 50 nm, most preferably 0.5 to 20 nm. It is not necessary that the thickness is uniform throughout the layer, and thus there may be a thin portion and a thick portion in the layer. It is rather preferable that there is a thin portion, as light permeability is improved. There may be some pores in the thin portion.

The metal oxide for forming the second layer or the third layer is an oxide which has comparatively high light permeability and excellent bonding characteristics with respect to metal, and the metal of the oxide may be at least one metal selected from the group consisting of Ni, Ti, Sn, Cr, Co, Zn, Cu, Mg, and In. In a particularly preferred embodiment, the second or the third layer is formed predominantly from NiO, TiO, SnO, $Cr_2O_3$, CoO, ZnO, $Cu_2O$, MgO, $In_2O_3$, which are known to have light permeability, or a composite oxide composed of any of these oxides and another metal element. Among these oxides, an oxide of Ni and/or Co is preferred. The oxide preferably has an excellent bonding property with respect to the metal element(s) contained in the first layer. For example, when the first layer is formed from Au, an oxide of Ni and/or Co is particularly preferred. In this case, Au contained in the first layer is preferably alloyed with Ni and/or Co.

As used herein, the term "metal oxide" refers to a mixture of metal oxides having different oxidation numbers. The metal oxide may contain a non-oxidized metallic element. However, the second and third layers are characterized by exhibiting light permeability, and needless to say, the oxide material which provides the highest light permeability is advantageously selected, as a predominant component, from the oxides having different compositions. Taking Ni as an example, these oxides are further described. Ni oxides are known to include NiO, $Ni_2O_3$, $NiO_2$, and $Ni_3O_4$. The material for forming the third layer may contain any of these Ni oxide species, and may contain these species in combination. In addition, non-oxidized, elemental Ni may also be contained. However, among these Ni oxide species, NiO is known to exert light permeability most effectively. Thus, needless to say, the second layer and the third layer are formed of NiO as a predominant component.

The reason why contact resistance is reduced by the presence of the second layer has not been completely elucidated. However, one conceivable reason is as follows.

The surface of a gallium nitride semiconductor is oxidized in air, thereby forming a Ga oxide film. Even though the oxide film is removed through etching or a similar process, the surface is immediately re-oxidized when exposed for a very short instance to the atmosphere before formation of an electrode. As Ga oxide is an insulator, formation of oxide film results in an increase in contact resistance at an electrode/semiconductor interface. According to the present invention, a portion of the second group metal atoms contained in the electrode material reacts with a portion of oxygen atoms contained in the oxide film formed of the semiconductor surface, thereby forming a metal oxide and decreasing the amount of the oxide film formed on the semiconductor surface. Accordingly, contact resistance is considered to be reduced due to the presence of the second layer. A portion of the thus-formed metal oxide is thought to be migrated to the top surface of the electrode, to thereby form a portion of the third layer.

As a result of a decrease in oxide film formed on the semiconductor surface, Ga oxide is removed from a portion originally covered by a very thin oxide film. The proportion of such an oxide-lacking portion is preferably as high as possible. The portion of the semiconductor surface, which portion is not in contact with the second layer, preferably includes an oxygen-lacking portion accounting for 10% or more of the semiconductor surface, as a low contact resistance can then be obtained. More preferably, the proportion is 50% or higher, with 90% or higher being particularly preferred.

The proportion of the second layer with respect to the entire surface area of the semiconductor is preferably 0.01 to 90%. When the proportion is 0.01% or less, removal of Ga oxide formed on the semiconductor surface and decrease in contact resistance are insufficient, whereas when the proportion is 90% or higher, contact resistance increases. Thus, the proportion is preferably 0.1 to 50%, particularly preferably 1 to 20%.

The thickness of the second layer is determined in accordance with the amount of Ga oxide formed on the semiconductor surface (i.e., amount of oxygen), and is generally 0.1 to 100 nm. When the thickness is 0.1 nm or less, Ga oxide formed on the semiconductor surface is not sufficiently removed, and the contact resistance does not decrease. The thickness of the second layer increases with the amount of Ga oxide formed on the semiconductor surface. However, as the second layer has high transparency, and is not present over the entirety of semiconductor surface, light permeability is not greatly impaired even when a thick second layer is formed. However, when the thickness is in excess of 100 nm and the surface area of the second layer reaches a certain level, contact resistance rather increases. Thus, the thickness is preferably 0.2 to 50 nm, more preferably 0.5 to 20 nm.

In the case where the electrode of the present invention has a third layer, the metal oxide forming the third layer may be selected independently from that forming the second layer. However, if different materials are selected, the production steps become cumbersome. Thus, the second and third layers are preferably produced from the same material.

Preferably, the third layer is formed, at a uniform thickness, continuously on the entire surface of the first layer. When a portion of the third layer contains pores similar to those of the first layer, the decrease in contact resistance is disadvantageously small. The third layer preferably has a thickness of 1 to 50 nm. When the thickness is 1 nm or less, the decrease in contact resistance is small, whereas when the thickness is 50 nm or more, the light permeability decreases. The thickness is more preferably 5 to 25 nm, particularly preferably 10 to 15 nm.

The inventive electrode may be produced by forming, on the semiconductor surface, a layer containing a metal component for forming a metal oxide of the second layer; forming thereon a metal component layer forming the first layer; and heating the stacked body, to thereby oxidize the second layer and optionally alloy the first layer in accordance with need. In the case where the electrode includes a third layer, a layer containing a metal component for forming the third layer is formed on the metal component layer forming the first layer, and the stacked body is heated in an oxygen atmosphere, to thereby perform oxidation and alloying in accordance with need. When the second and third layers are formed from the same material, formation of the layer containing a metal component forming the metal oxide of the second layer may be eliminated, thereby simplifying the production steps.

The metal films can be formed through a generally employed method such as vapor deposition by resistance heating, vapor deposition by electron beam heating, or sputtering. The metal films may be formed continuously in a single apparatus. Alternatively, a stacked body may be removed from an apparatus after formation of a first metal layer, and a subsequent metal layer may be formed through another method. However, in order to attain a more improved adhesiveness, all the metal layers are preferably formed continuously in a single apparatus.

The temperature and time of heating for oxidation must be selected in accordance with the type of the metal to be oxidized. According to a study conducted by the present inventors, the temperature and the time are generally 350 to 600° C. and 1 to 120 minutes with respect to metal species which can be employed in the present invention. When a high temperature is selected, the treatment is performed for a short period of time, whereas when a low temperature is selected, the treatment is performed for a longer period of time. In the case where the electrode includes a third layer, heat treatment is preferably performed in an oxygen atmosphere. Generally, the oxygen concentration may be appropriately selected from a range of 5 to 100%, in accordance with the temperature and time of the treatment.

When the first layer is formed from an alloy, heat treatment for alloying may be performed separately. However, by appropriately selecting the temperature and time of the treatment from the aforementioned ranges, both alloying and oxidation can be performed in the same heating step. Particularly when the layers are formed from the same component, preferably, oxidation and alloying are performed simultaneously by a single heat treatment process, from the viewpoint of simplicity of the steps.

EXAMPLES

The present invention will next be described in more detail by way of examples, which should not be construed as limiting the invention thereto.

Example 1

Figure 2:
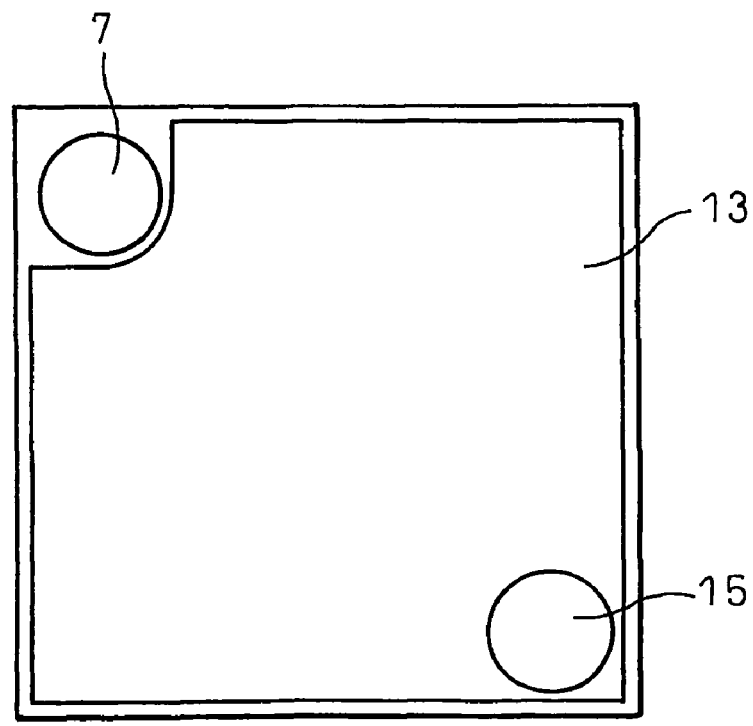
FIG. 2 is a plan view showing a gallium nitride-based compound semiconductor light-emitting device produced according to the present invention in Example 1.

FIG. 1 shows a cross section of a gallium nitride-based compound semiconductor light-emitting device produced in Example 1, and FIG. 2 is a plan view of the same. In FIG. 1, an AlN buffer layer (2) is formed on a sapphire substrate (1). On the buffer layer (2), an n-type GaN layer (3), which forms n-contact layer and an n-clad layer, an InGaN light-emitting layer (4), a p-type AlGaN clad layer (5), and a p-type GaN contact layer (6) are sequentially formed, to thereby provide a semiconductor stacked body. A negative electrode (7) is formed on the n-contact layer (3), and the electrode (10) according to the present invention and a positive electrode bonding pad (15) are formed on the p-contact layer (6).

The procedure of forming the light-emitting device will next be described.

Firstly, the aforementioned layers (2) to (6) were stacked on the substrate (1) through a known method, to thereby fabricate a gallium nitride-based compound semiconductor element. Subsequently, a metal film was formed on the compound semiconductor element through employment of a photolithography technique, a deposition method, and a lift-off technique, which are known. The metal film was provided in order to protect portions of the semiconductor layer formed on the substrate other than a portion of the semiconductor layer during dry etching. Specifically, an Ni film and a Ti film were formed in this sequence through an electron-beam method by use of a vapor deposition apparatus at an initial pressure of $4 \times 10^{-4}$ Pa so that the thickness ratio of Ni film to Ti film was controlled to about 1:6; i.e., 500 Å:3,000 Å.

The semiconductor element was dry-etched to a predetermined depth, and the remaining film was removed through a known etching technique. The dry etching included removal of the stacked p-type layer so as to expose the n-type layer on which the negative electrode (7) of the semiconductor light-emitting device was to be formed.

Thereafter, on a portion which had not been etched during the aforementioned dry etching, the electrode (10) of the present invention was formed through a known photolithography technique, a known deposition method, and a known lift-off technique. The electrode of the present invention was fabricated in the following manner. Specifically, an Au film and an Ni film were formed in this sequence by use of a vapor deposition apparatus employing a tungsten boat for resistance heating at an initial pressure of $4 \times 10^{-4}$ Pa so that the thickness ratio of Au film to Ni film was controlled to about 2:3; i.e., 50 Å:75 Å. Then, the laminated film was heated in the atmosphere to perform oxidation and alloying, with the following temperature profile: heating to 450° C. for 5 minutes, maintaining at 450° C. for 5 minutes, and cooling to ambient temperature for 5 minutes. The electrode (10) fabricated through the aforementioned steps assumed a bluish dark gray color and exhibited light permeability. The electrode was found to exhibit a transmittance of about 65% or higher with respect to light of a wavelength of 460 nm.

Subsequently, in the following manner, the positive electrode bonding pad (15) for allowing current flow to the electrode (10) was formed, through a known photolithography technique, a known deposition method, and a known lift-off technique, such that the bonding pad (15) was brought into contact with the electrode (10). Specifically, Ti, Al, Ti, and Au layers were formed in this sequence through an electron-beam method by use of a vacuum vapor deposition apparatus employing a tungsten boat for resistance heating at an initial pressure of $4 \times 10^{-4}$ Pa so that the film thickness proportions were controlled to 1:0.1:1:2; i.e., 1,000 Å:100 Å. 1,000 Å:2,000 Å.

Finally, in the following manner, the negative electrode was formed on the n-type layer, which had been exposed through the aforementioned dry etching, through a known photolithography technique, a known deposition method, and a known lift-off technique. Specifically, a Ti film and an Au film were formed in this sequence through an electron-beam method by use of a vacuum vapor deposition apparatus employing a tungsten-made boat for resistance heating at an initial pressure of $4 \times 10^{-4}$ Pa so that the thickness ratio of the Au film to the Ni film was controlled to 1:2; i.e., 1,000 Å:2,000 Å.

The thus-fabricated light-emitting device was tested by use of a wavemeter. The light emission induced by current application (20 mA) was detected from the top surface of the light-emitting device, while the probes were brought into contact with the positive electrode bonding pad (15) and the negative electrode (7). As a result, the light-emitting device was found to emit light of a wavelength of 460 nm (power: 5 mW) at a forward voltage of 3.3 V.

The electrode (10) was cut through an FIB process, and the cross-section was observed under a transmission electron microscope (accelerating voltage: 200 kV). The structural features of the electrode (10) were confirmed on the basis of the following techniques.

Composition: Energy-dispersion X-ray spectroscopic analysis

Layer thickness: Observation under a transmission electron microscope

Ratio of a specific portion in a layer: Compositional distribution observed through energy-dispersion X-ray spectroscopic analysis Through the analysis, the electrode (10) was found to have the following structural features.

The first layer (11) was found to be composed of an Au—Ni alloy and had a mean Ni content of about 35%. The layer had in-plane variations in composition. An Au-rich portion had an Ni content of 11 to 25%, whereas an Ni-rich portion had an Ni content of 55 to 61%. The thickness of the layer was found to be 15 nm.

The second layer (12) was found to be composed of an Ni oxide, accounted for 10% of the entire area of the semiconductor surface, and had a thickness of 3 nm. A portion of the semiconductor surface, which portion was not in contact with the second layer, included an oxygen-lacking portion (16). The portion was found to account for 90% of the entire area of the semiconductor surface.

The third layer (13) was found to be composed of an Ni oxide, and had a thickness of 10 nm. Beneath the third layer, there were pores (14) (i.e., absence of the first or second layer) having a depth of 15 nm formed on the semiconductor surface.

Example 2

The procedure of Example 1 was repeated, except that the following heat treatment temperature conditions were employed: heating from ambient temperature to 450° C. for 10 seconds, maintaining at 450° C. for 1 minute, and cooling to ambient temperature for 10 seconds.

Similar to Example 1, the presence of the second layer and the third layer both formed of an Ni oxide was confirmed. In the first layer, Au and Ni were found to be alloyed together. The light-emitting device was found to emit light, under current (20 mA), of a wavelength of 460 nm (power: 5 mW) at a forward voltage of 3.2 V.

Example 3

The procedure of Example 1 was repeated, except that the following heat treatment temperature conditions were employed: heating from ambient temperature to 450° C. for 10 seconds, maintaining at 450° C. for 7 minutes, and cooling to ambient temperature for 10 seconds.

Similar to Example 1, the presence of the second layer and the third layer both formed of an Ni oxide was confirmed. In the first layer, Au, Ni and Ga were found to be alloyed together. The first layer had in-plane variations in Ga content, and the Ga content accounted for 1 to 30 atom % of the total metal atoms. The light-emitting device was found to emit light, under current (20 mA), of a wavelength of 460 nm (power: 5 mW) at a forward voltage of 3.1 V.

Example 4

The procedure of Example 1 was repeated, except that Au and Co were employed instead of Au and Ni for a metal material of the inventive electrode (10).

Similar to Example 1, the presence of the second layer and the third layer both formed of an Co oxide was confirmed. In the first layer, Au, Co and Ga were found to be alloyed together. The first layer had in-plane variations in Ga content, and the Ga content accounted for 1 to 20 atom % of the total metal atoms. The light-emitting device was found to emit light, under current (20 mA), of a wavelength of 460 nm (power: 5 mW) at a forward voltage of 3.3 V.

Comparative Example 1

The procedure of Example 1 was repeated, except that the following heat treatment conditions were employed: heating under vacuum at 350° C. for 10 minutes. No second layer or third layer formed of an Ni oxide was observed. The metallic material forming the first layer was scarcely alloyed. The light-emitting device was found to emit light, under current (20 mA), of a wavelength of 460 nm (power: 3 mW) at a forward voltage of 3.8 V.

Comparative Example 2

The procedure of Example 1 was repeated, except that the following heat treatment conditions were employed: heating under vacuum at 600° C. for 10 minutes. No second layer or third layer formed of an Ni oxide was observed. The metallic material forming the first layer was alloyed. The light-emitting device was found to emit light, under current (20 mA), of a wavelength of 460 nm (power: 3.2 mW) at a forward voltage of 3.8 V.

Comparative Example 3

The procedure of Example 1 was repeated, except that the following heat treatment conditions were employed: heating in oxygen (3 Pa) at 550° C. for 3 minutes. No second layer formed of an Ni oxide was observed, but the third layer formed of an Ni oxide was observed. The metallic material forming the first layer was alloyed. The light-emitting device was found to emit light, under current (20 mA), of a wavelength of 460 nm (power: 3.5 mW) at a forward voltage of 3.8 V.

Comparative Example 4

The procedure of Example 1 was repeated, except that the following heat treatment conditions were employed: heating in Ar containing 20% oxygen at 500° C. for 10 minutes. No second layer formed of an Ni oxide was observed, but the third layer formed of an Ni oxide was observed. The metallic material forming the first layer was alloyed. The light-emitting device was found to emit light, under current (20 mA), of a wavelength of 460 nm (power: 4.5 mW) at a forward voltage of 3.5 V.

INDUSTRIAL APPLICABILITY

The electrode of the present invention for use in a gallium nitride-based compound semiconductor light-emitting device is useful as a light-permeable positive electrode of a gallium nitride-based compound semiconductor light-emitting device.

The invention claimed is:

1. An electrode for use in a gallium nitride-based compound semiconductor light-emitting device comprising one and only one continuous light-permeable first layer which is in contact with a surface of a p-contact layer in a gallium nitride-based compound semiconductor light-emitting device and which is capable of providing ohmic contact, and a second layer which is in contact with a part of a surface of said p-contact layer, wherein said first layer comprises a metal, or an alloy of two or more metals, selected from a first group consisting of Au, Pt, Pd, Ni, Co, and Rh, and said second layer comprises an oxide of at least one metal selected from a second group consisting of Ni, Ti, Sn, Cr, Co, Zn, Cu, Mg, and In, and wherein the second layer is parted in plural portions on the surface of the p-contact layer.

2. An electrode according to claim 1, wherein said first layer further comprises Ga.

3. An electrode according to claim 1, wherein a portion of the surface of said p-contact layer, which portion is not in contact with said second layer, includes an oxygen-lacking portion.

4. An electrode according to claim 1, which further comprises a third layer on a surface of said first layer opposite the side in contact with said p-contact layer, said third layer comprising an oxide of at least one metal selected from said second group.

5. An electrode according to claim 1, wherein said first layer comprises an alloy of Au with Ni and/or Co.

6. An electrode according to claim 1, wherein said second layer comprises an oxide of Ni and/or Co.

7. An electrode according to claim 4, wherein said third layer comprises an oxide of Ni and/or Co.

8. An electrode according to claim 1, wherein said second layer accounts for 0.01 to 90% of the surface of said p-contact layer.

9. An electrode according to claim 3, wherein said oxygen-lacking portion accounts for 10% or more of the surface of said p-contact layer.

10. An electrode according to claim 1, wherein said second layer has a thickness of 0.1 to 100 nm.

11. An electrode according to claim 5, wherein said alloy of said first layer has an Ni and/or Co content of 0.01 to 70 atom %.

12. An electrode according to claim 1, wherein said first layer has a thickness of 0.1 to 100 nm.

13. An electrode according to claim 4, wherein said third layer has a thickness of 1 nm or more.

14. An electrode according to claim 1, wherein said first layer has one or more pores in a portion thereof.

15. An electrode according to claim 1, wherein said first layer has a thick portion and a thin portion.

16. A gallium nitride-based compound semiconductor light-emitting device comprising an n-contact layer, a light-emitting layer and a p-contact layer formed on a substrate, which are composed of a gallium nitride-based compound semiconductor and which are sequentially stacked in the above order, and a negative electrode and a positive electrode which are formed on a surface of said n-contact layer and a surface of said p-contact layer, respectively, wherein said positive electrode is formed of an electrode according to claim 1.

* * * * *